(12) United States Patent
Nishibayashi et al.

(10) Patent No.: US 8,819,923 B2
(45) Date of Patent: Sep. 2, 2014

(54) JOINT APPARATUS

(75) Inventors: Takahiro Nishibayashi, Tokyo (JP);
Tatsuya Kitayama, Koshi (JP); Naoto Yoshitaka, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 27 days.

(21) Appl. No.: 13/574,798

(22) PCT Filed: Feb. 21, 2011

(86) PCT No.: PCT/JP2011/053674
§ 371 (c)(1),
(2), (4) Date: Jul. 24, 2012

(87) PCT Pub. No.: WO2011/105326
PCT Pub. Date: Sep. 1, 2011

(65) Prior Publication Data
US 2012/0291267 A1 Nov. 22, 2012

(30) Foreign Application Priority Data
Feb. 26, 2010 (JP) .................................. 2010-043380

(51) Int. Cl.
*B23P 21/00* (2006.01)
*B23Q 15/00* (2006.01)

(52) U.S. Cl.
USPC .................................. 29/721; 29/722; 29/738

(58) Field of Classification Search
USPC .............. 29/721, 722, 738, 743; 156/64, 103, 156/291, 299, 752; 438/455, 458, 459
See application file for complete search history.

(56) References Cited

U.S. PATENT DOCUMENTS

| 6,309,505 | B1 | 10/2001 | Takisawa et al. |
| 6,790,300 | B2 * | 9/2004 | Watanabe et al. ............... 156/64 |
| 7,811,898 | B2 * | 10/2010 | Thallner ....................... 438/455 |

FOREIGN PATENT DOCUMENTS

| JP | A-07-006937 | 1/1995 |
| JP | A-10-256107 | 9/1998 |
| JP | A-2004-207436 | 7/2004 |
| JP | A-2007-036130 | 2/2007 |
| JP | A-2007-201196 | 8/2007 |
| JP | A-2009-049081 | 3/2009 |
| JP | A-2009-200156 | 9/2009 |
| JP | A-2010-034445 | 2/2010 |
| WO | WO 2009/139190 | 11/2009 |

OTHER PUBLICATIONS

International Search Report mailed on May 24, 2011 in corresponding International Application No. PCT/JP2011/053674 (with English copy enclosed).

* cited by examiner

*Primary Examiner* — Thiem Phan
(74) *Attorney, Agent, or Firm* — Posz Law Group, PLC

(57) ABSTRACT

In a joint apparatus, a transfer region and a processing region are formed. In the transfer region, a transfer mechanism transferring a first substrate, a second substrate, or a superposed substrate, a position adjusting mechanism adjusting an orientation in a horizontal direction of the first substrate or the second substrate, and a reversing mechanism reversing front and rear surfaces of the second substrate are provided. In the processing region, a first holding member mounting and holding the first substrate on an upper surface thereof, a second holding member holding the second substrate on a lower surface thereof, and a pressing and moving member bringing one end portion of the first substrate and one end portion of the second substrate into abutment with each other and pressing the one end portions when joining the first substrate and the second substrate together are provided.

16 Claims, 10 Drawing Sheets

JOINT APPARATUS

TECHNICAL FIELD

The present invention relates to a joint apparatus joining substrates together.

BACKGROUND ART

Recently, semiconductor devices become more highly integrated. When a plurality of highly integrated semiconductor devices are arranged within a horizontal plane and connected with one another by wiring into a product, the wiring length may increase to lead to an increase in resistance of the wiring and increase in a wiring delay.

Hence, it is proposed to use the three-dimensional integration technology of stacking the semiconductor devices in three dimensions. In this three-dimensional integration technology, for example, a bonding apparatus is used to join two semiconductor wafers (hereinafter, referred to as "wafers"). The bonding apparatus has, for example, a chamber housing two wafers arranged one above the other (hereinafter, the wafer on the upper side is referred to as an "upper wafer" and the wafer on the lower side is referred to as a "lower wafer"), a pressing and moving pin provided in the chamber and pressing the central portion of the upper wafer, and a spacer capable of supporting the outer periphery of the upper wafer and retreating from the outer periphery of the upper wafer. In the case of using the bonding apparatus, the joint of the wafers is performed with the inside of the chamber brought into a vacuum atmosphere so as to suppress generation of void between the wafers. Concretely, the pressing and moving pin first presses the central portion of the upper wafer with the spacer supporting the upper wafer, to bring the central portion into abutment with the lower wafer. Thereafter, the spacer supporting the upper wafer is retreated to bring the entire surface of the upper wafer into abutment with the entire surface of the lower wafer to bond them together (Patent Document 1).

[Patent Document 1] Japanese Patent Application Laid-open No. 2004-207436

DISCLOSURE OF THE INVENTION

Problems to be Solved by the Invention

However, in the case of using the bonding apparatus described in Patent Document 1, it is necessary to bring the whole inside of the chamber into a vacuum atmosphere and therefore it takes a lot of time to form the vacuum atmosphere in the chamber after the wafer is housed therein. As a result, the throughput of the whole wafer joint processing sometimes decreases.

Further, in the case of using the boding apparatus, the position of the upper wafer with respect to the lower wafer may be displaced because the upper wafer is supported only by the spacer when the pressing and moving pin presses the central portion of the upper wafer.

The present invention has been made in consideration of the above points and its object is to appropriately and efficiently join substrates together while suppressing generation of void between the substrates.

Means for Solving the Problems

In order to achieve the above object, the present invention is a joint apparatus joining substrates together, including: a first holding member mounting and holding a first substrate on an upper surface thereof; a second holding member provided above the first holding member to face the first holding member, and holding a second substrate on a lower surface thereof; a pressing and moving member bringing one end portion of the first substrate and one end portion of the second substrate facing the one end portion of the first substrate into abutment with each other and pressing the one end portions when joining the first substrate and the second substrate together; a reversing mechanism reversing front and rear surfaces of the second substrate; and a transfer mechanism transferring the first substrate, the second substrate, or a superposed substrate inside the joint apparatus.

According to the joint apparatus of the present invention, the first substrate is first held on the first holding member, then the front and rear surfaces of the second substrate are reversed by the reversing mechanism, and the second substrate is then held on the second holding member. Thereafter, the first substrate and the second substrate are arranged to face each other at a predetermined interval, and the pressing and moving member brings the one end portion of the first substrate and the one end portion of the second substrate into abutment with each other and presses them. Then, in the state that the one end portion of the first substrate and the one end portion of the second substrate are pressed to each other, the second substrate is brought into abutment with the first substrate in sequence from the one end portion side to the other end portion side of the second substrate, whereby the first substrate and the second substrate can be joined together. Accordingly, even if, for example, air which can form void exists between the first substrate and the second substrate, the air will exist at all times outside the position where the second substrate is in abutment with the first substrate, that is, on the other end portion side, so that the air can escape in one direction from between the substrates. Therefore, according to the present invention, it is possible to appropriately join the substrates together while suppressing the generation of void between the substrates. In addition, according to the present invention, since it is unnecessary to bring the atmosphere when joining the substrates together into a vacuum atmosphere as in the prior art, the joint of the substrates can be efficiently performed in a short time, resulting in an improved throughput of the substrate joint processing. Further, according to this embodiment, the one end portion of the second substrate and the one end portion of the first substrate can be brought into abutment with each other in the state that the second substrate is held by the second holding member, so that the joint of the substrates can be appropriately performed without displacement of the position of the second substrate with respect to the first substrate.

The second holding member may suction-hold the second substrate by vacuuming the second substrate, and the second holding member may be divided into a plurality of regions, and the vacuuming of the second substrate may be settable for each of the regions.

A pressure inside the joint apparatus may be positive with respect to an external pressure.

At least the first holding member or the second holding member may have a cooling mechanism cooling at least the first substrate or the second substrate.

A position adjusting mechanism adjusting an orientation in a horizontal direction of the first substrate or the second substrate may be provided, and the reversing mechanism may be movable between the position adjusting mechanism and the second holding member.

A transition temporarily mounting the first substrate, the second substrate, or the superposed substrate thereon to transfer in/out the first substrate, the second substrate, or the superposed substrate to/from an outside may be provided.

A guide member disposed between the first holding member and the second holding member and to face the pressing and moving member may be provided, and the guide member may be configured to support another end portion of the second substrate held by the second holding member and to be movable in a horizontal direction.

A moving mechanism moving the first holding member or the second holding member relatively in a horizontal direction; and another position adjusting mechanism controlling the moving mechanism to perform alignment in the horizontal direction of the first substrate held by the first holding member with the second substrate held by the second holding member may be provided, the another position adjusting mechanism may include a first image-pickup member picking up an image of a front surface of the first substrate and a second image-pickup member picking up an image of a front surface of the second substrate, and the moving mechanism may adjust relative positions in the horizontal direction of the first holding member and the second holding member so that a reference point on the first substrate in an image picked up by the first image-pickup member coincides with a reference point on the second substrate in an image picked up by the second image-pickup member. Note that the front surface of the substrate means a joint surface where the substrate is joined.

Effect of the Invention

According to the present invention, the joint of substrates can be appropriately and efficiently performed while suppressing generation of void between substrates.

BEST MODE FOR CARRYING OUT THE INVENTION

Figure 1:
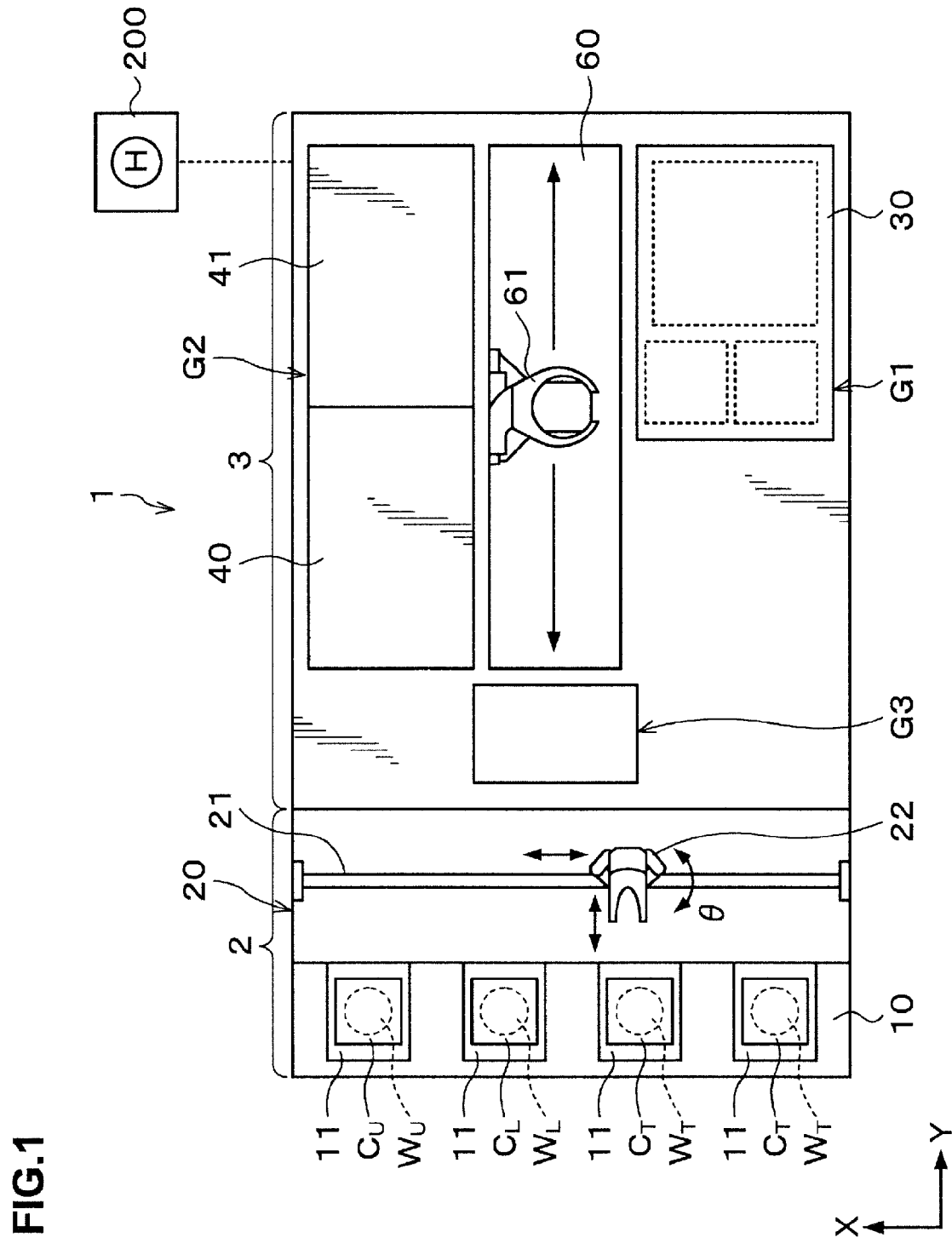
FIG. 1 A plan view illustrating the outline of the configuration of a joint system including a joint apparatus according to this embodiment.
Figure 2:
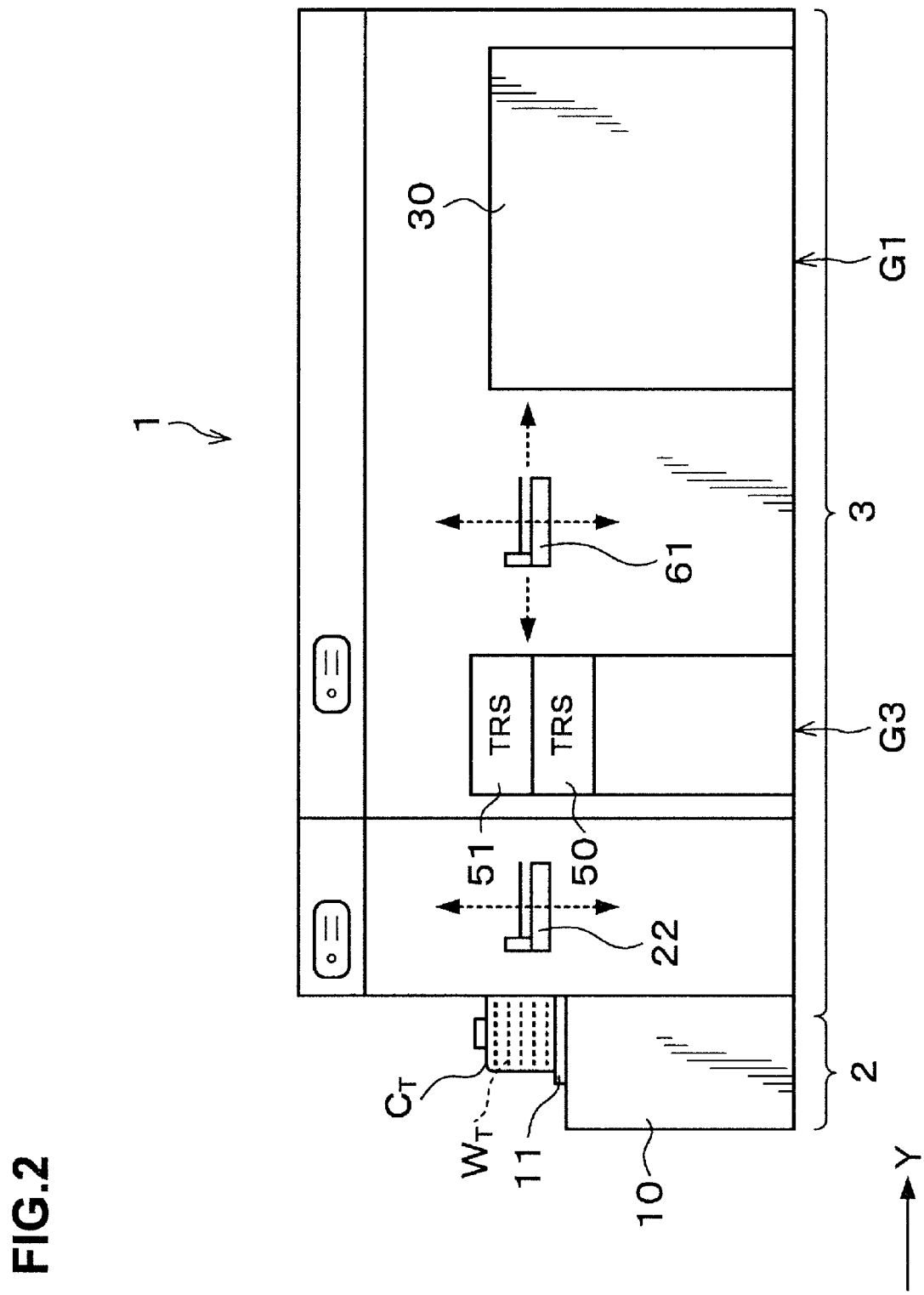
FIG. 2 A side view illustrating the outline of the internal configuration of the joint system including the joint apparatus according to this embodiment.

Hereinafter, an embodiment of the present invention will be described. FIG. 1 is a plan view illustrating the outline of the configuration of a joint system 1 including a joint apparatus according to this embodiment. FIG. 2 is a side view illustrating the outline of the internal configuration of the joint system 1.

Figure 3:
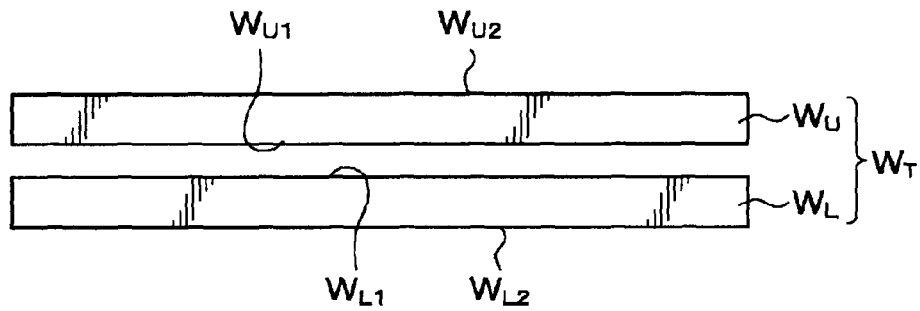
FIG. 3 A side view of an upper wafer and a lower wafer.

In the joint system 1, for example, wafers $W_U$, $W_L$ as two substrates are joined together as illustrated in FIG. 3. Hereinafter, the wafer located on the upper side is referred to as an "upper wafer $W_U$" as a second substrate and the wafer located on the lower side is referred to as a "lower wafer $W_L$" as a first substrate. Further, the joint surface at which the upper wafer $W_U$ is to be joined is referred to as a "front surface $W_{U1}$" and the surface opposite to the front surface $W_{U1}$ is referred to as a "rear surface $W_{U2}$." Similarly, the joint surface at which the lower wafer $W_L$ is to be joined is referred to as a "front surface $W_{L1}$" and the surface opposite to the front surface $W_{L1}$ is referred to as a "rear surface $W_{L2}$." In the joint system 1, the upper wafer $W_U$ and the lower wafer $W_L$ are joined together to form a superposed wafer $W_T$ as a superposed substrate.

The joint system 1 has the configuration in which a transfer-in/out station 2 to/from which cassettes $C_U$, $C_L$, $C_T$ capable of housing a plurality of wafers $W_U$, $W_L$ and a plurality of superposed wafers $W_T$ respectively are transferred from/to the outside, and a processing station 3 including various kinds of processing apparatuses performing predetermined processing on the wafers $W_U$, $W_L$ and superposed wafers $W_T$, are integrally connected as illustrated in FIG. 1.

In the transfer-in/out station 2, a cassette mounting table 10 is provided. On the cassette mounting table 10, a plurality of, for example, four cassette mounting plates 11 are provided. The cassette mounting plates 11 are arranged side by side in a line in an X-direction (a top-down direction in FIG. 1) being the horizontal direction. On the cassette mounting plates 11, the cassettes $C_U$, $C_L$, $C_T$ can be mounted when the cassettes $C_U$, $C_L$, $C_T$ are transferred in/out from/to the outside of the joint system 1. As described above, the transfer-in/out station 2 is configured to be capable of holding a plurality of upper wafers $W_U$, a plurality of lower wafers $W_L$, and a plurality of superposed wafers $W_T$. Note that the number of cassette mounting plates 11 is not limited to this embodiment but can be arbitrarily determined. Further, one of the cassettes may be used for collecting defective wafers. In other words, the cassette is a cassette that is capable of separating wafers having defects in jointing the upper wafer $W_U$ and the lower wafer $W_L$ occurred due to various causes, from other normal superposed wafers $W_T$. In this embodiment, one cassette $C_T$ among the plurality of cassettes $C_T$ is used for collecting the defective wafers, and the other cassettes $C_T$ are used for housing normal superposed wafers $W_T$.

In the transfer-in/out station 2, a wafer transfer part 20 is provided adjacent to the cassette mounting table 10. In the wafer transfer part 20, a wafer transfer apparatus 22 movable on a transfer path 21 extending in the X-direction is provided. The wafer transfer apparatus 22 is movable also in the vertical direction and around the vertical axis (in a θ-direction) and thus can transfer the wafers $W_U$, $W_L$ and the superposed wafers $W_T$ between the cassettes $C_U$, $C_L$, $C_T$ on the cassette mounting plates 11 and later-described transition apparatuses 50, 51 in a third processing block G3 in the processing station 3.

In the processing station 3, a plurality of, for example, three processing blocks G1, G2, G3 each including various kinds of apparatuses are provided. The first processing block G1 is provided, for example, on the front side in the processing station 3 (on an X-direction negative direction side in FIG. 1), and the second processing block G2 is provided on the back side in the processing station 3 (on an X-direction positive direction side in FIG. 1). Further, the third processing block G3 is provided on the transfer-in/out station 2 side in the processing station 3 (on a Y-direction negative direction side in FIG. 1).

For example, in the first processing block G1, a surface activation apparatus 30 activating the front surfaces $W_{U1}$, $W_{L1}$ of the wafers $W_U$, $W_L$ is disposed.

For example, in the second processing block G2, a surface hydrophilizing apparatus 40 hydrophilizing the front surfaces $W_{U1}$, $W_{L1}$ of the wafers $W_U$, $W_L$ and cleaning the front surfaces $W_{U1}$, $W_{L1}$ with, for example, pure water and a joint apparatus 41 joining the wafers $W_U$, $W_L$ together are arranged side by side in a Y-direction being a horizontal direction in this order from the transfer-in/out station 2 side.

For example, in the third processing block G3, the transition apparatuses 50, 51 for the wafers $W_U$, $W_L$ and superposed wafer $W_T$ are provided at two tiers in order from the bottom as illustrated in FIG. 2.

In a region surrounded by the first processing block G1 to the third processing block G3, a wafer transfer region 60 is formed as illustrated in FIG. 1. In the wafer transfer region 60, for example, a wafer transfer apparatus 61 is disposed.

The wafer transfer apparatus 61 has a transfer arm movable, for example, in the vertical direction, the horizontal direction (the Y-direction, the X-direction) and around the vertical axis. The wafer transfer apparatus 61 can move in the wafer transfer region 60 to transfer the wafers $W_U$, $W_L$ and the superposed wafer $W_T$ to a predetermined apparatus in the first processing block G1, the second processing block G2 and the third processing block G3 therearound.

Figure 4:
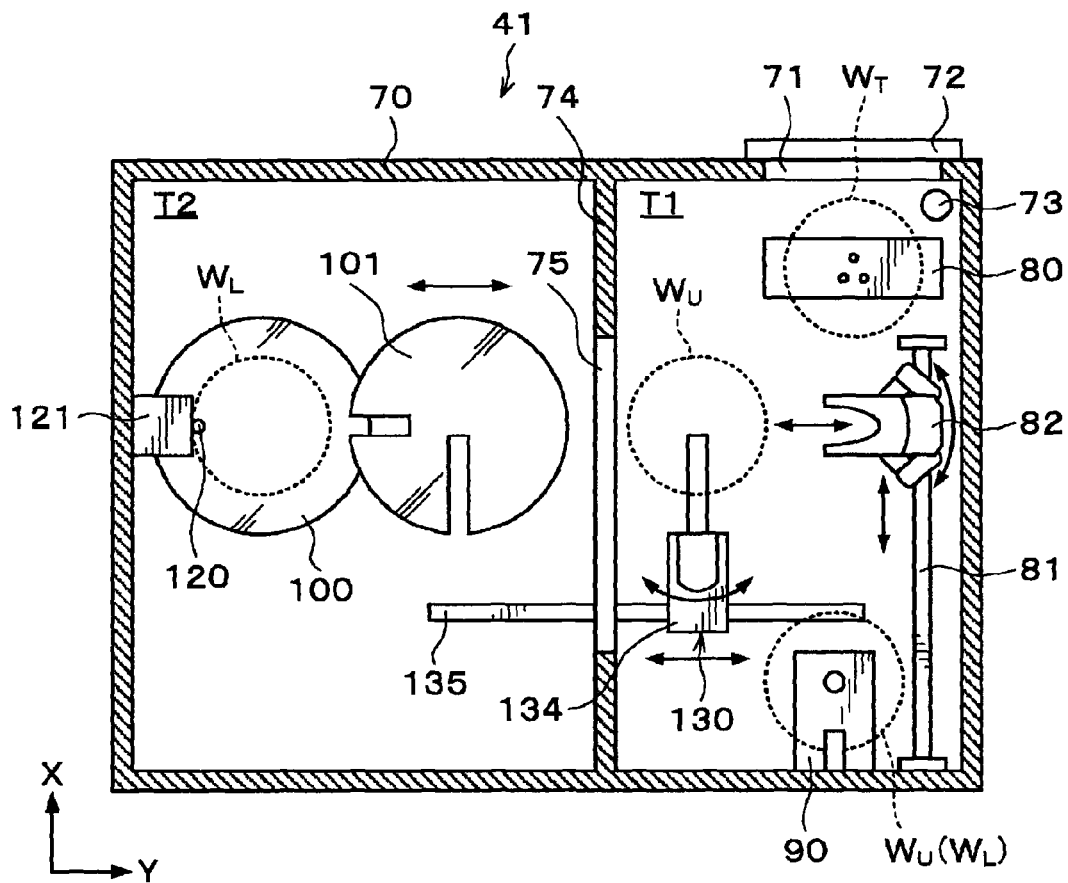
FIG. 4 A transverse sectional view illustrating the outline of the configuration of the joint apparatus.

Next, the configuration of the above-described joint apparatus 41 will be described. The joint apparatus 41 has a processing container 70 which can hermetically close the inside as illustrated in FIG. 4. A transfer-in/out port 71 for the wafers $W_U$, $W_L$ and the superposed wafer $W_T$ is formed in a side surface on the wafer transfer region 60 side of the processing container 70, and an opening/closing shutter 72 is provided at the transfer-in/out port 71. Note that an airflow directing downward called downflow is generated inside the processing container 70. Then, the atmosphere inside the processing container 70 is exhausted from an exhaust port 73 formed at a bottom surface of a later-described transfer region T1.

The inside of the processing container 70 is divided by an inner wall 74 into the transfer region T1 and a processing region T2. The above-described transfer-in/out port 71 is formed in the side surface of the processing container 70 in the transfer region T1. A transfer-in/out port 75 for the wafers $W_U$, $W_L$ and the superposed wafer $W_T$ is also formed in the side wall 74.

On an X-direction positive direction side in the transfer region T1, a transition 80 is provided for temporarily mounting the wafer $W_U$, $W_L$ or the superposed wafer $W_T$ thereon. Two transitions 80 are formed, for example, at two tiers and can mount any two of the wafers $W_U$, $W_L$ and the superposed wafer $W_T$ at the same time.

Figure 5:
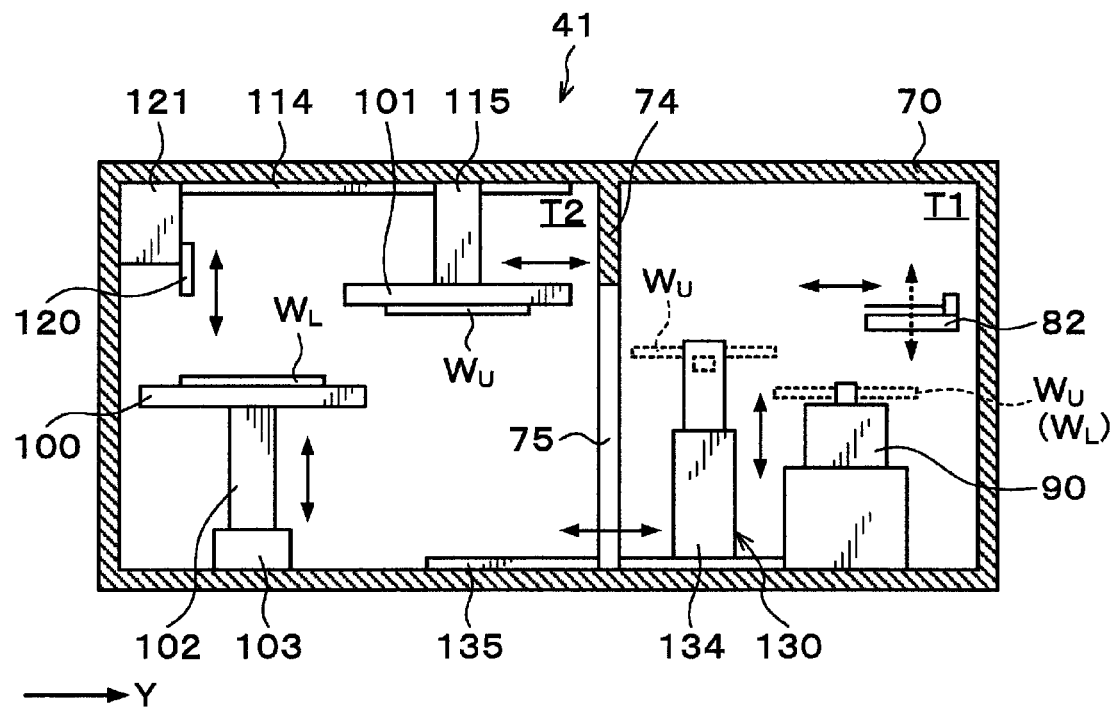
FIG. 5 A longitudinal sectional view illustrating the outline of the configuration of the joint apparatus.

In the transfer region T1, a wafer transfer body 82 is provided which is movable on a transfer path 81 extending in an X-direction. The wafer transfer body is also movable in the vertical direction and around the vertical axis as illustrated in FIG. 4 and FIG. 5, and can transfer the wafers $W_U$, $W_L$ and the superposed wafer $W_T$ in the transfer region T1 or between the transfer region T1 and the processing region T2. Note that the transfer path 81 and the wafer transfer body 82 constitute a transfer mechanism in this embodiment.

Figure 6:
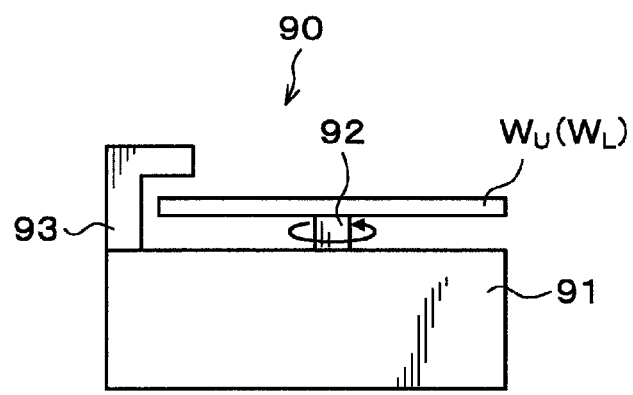
FIG. 6 A side view of a position adjusting mechanism.

On an X-direction negative direction side in the transfer region T1, a position adjusting mechanism 90 is provided which adjusts the orientation in the horizontal direction of the wafer $W_U$, $W_L$. The position adjusting mechanism 90 has a base 91, a holding part 92 suction-holding and rotating the wafer $W_U$, $W_L$, and a detection part 93 detecting the position of a notch portion of the wafer $W_U$, $W_L$ as illustrated in FIG. 6. Then, in the position adjusting mechanism 90, the position of the notch portion of the wafer $W_U$, $W_L$ is detected by the detection part 93 while the wafer $W_U$, $W_L$ suction-held by the holding part 92 is being rotated, whereby the position of the notch portion is adjusted to adjust the orientation in the horizontal direction of the wafer $W_U$, $W_L$.

In the processing region T2, a lower chuck 100 as a first holding member mounting and holding on its upper surface the lower wafer $W_L$ and an upper chuck 101 as a second holding member suction-holding on its lower surface the upper wafer $W_U$ are provided as illustrated in FIG. 4 and FIG. 5. The upper chuck 101 is provided above the lower chuck 100 and configured to be able to face the lower chuck 100. In other words, the lower wafer $W_L$ held by the lower chuck 100 and the upper wafer $W_U$ held by the upper chuck 101 can be arranged to face each other.

Inside the lower chuck 100, a suction pipe (not illustrated) communicating with a vacuum pump (not illustrated) is provided. By suction through the suction pipe, the lower wafer $W_L$ can be suction-held on the upper surface of the lower chuck 100.

Below the lower chuck 100, a chuck drive part 103 is provided via a shaft 102 as illustrated in FIG. 5. By means of the chuck drive part 103, the lower chuck 100 can freely rise and lower. Note that the lower chuck 100 may be movable in the horizontal direction and rotatable around the vertical axis by means of the chuck drive part 103.

Figure 7:
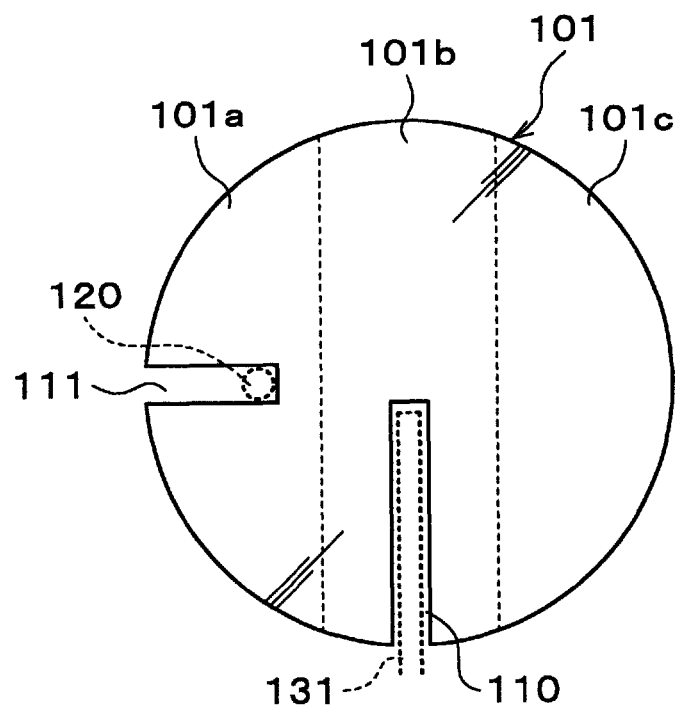
FIG. 7 A plan view of an upper chuck.

The upper chuck 101 is formed with two cutout portions 110, 111 as illustrated in FIG. 7. The first cutout portion 110 is formed so that the upper chuck 101 does not interfere with a holding arm 131 of a later-described reversing mechanism 130. Further, the second cutout portion 111 is formed so that the upper chuck 101 does not interfere with a later-described pressing and moving member 120.

Figure 8:
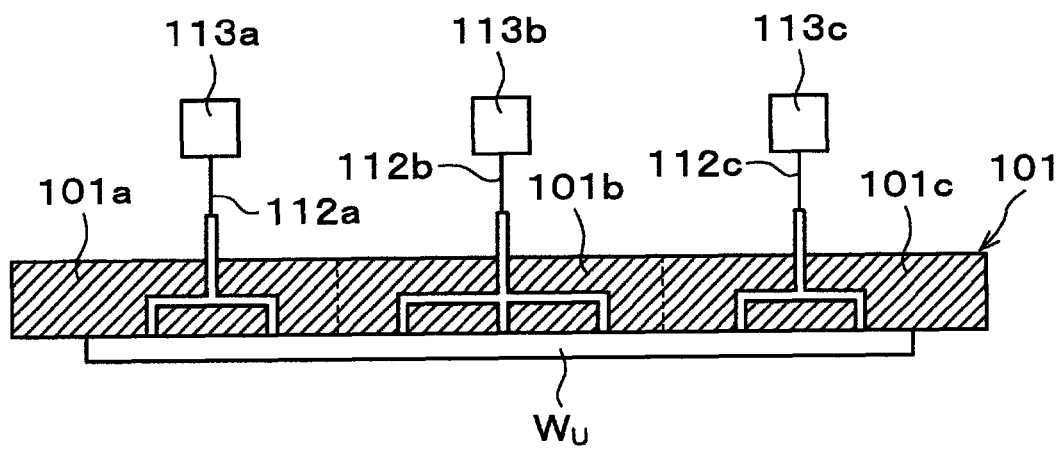
FIG. 8 A longitudinal sectional view of the upper chuck.

The inside of the upper chuck 101 is divided into a plurality of, for example, three regions 101a, 101b, 101c as illustrated in FIG. 8. In the regions 101a, 101b, 101c, suction pipes 112a, 112b, 112c are independently provided for suction-holding the upper wafer $W_U$. To the suction pipes 112a, 112b, 112c, different vacuum pumps 113a, 113b, 113c are connected respectively. Accordingly, the upper chuck 101 is configured such that vacuuming of the upper wafer $W_U$ can be set for each of the regions 101a, 101b, 101c.

Above the upper chuck 101, a rail 114 extending in a Y-direction is provided as illustrated in FIG. 5. The upper chuck 101 is movable on the rail 114 by means of a chuck drive part 115. Note that the upper chuck 101 may be movable in the vertical direction and rotatable around the vertical axis by means of the chuck drive part 115. Note that the upper chuck 101, the rail 114, and the chuck drive part 115 constitute a moving mechanism in this embodiment.

In the processing region T2, the pressing and moving member 120 is provided as illustrated in FIG. 4 and FIG. 5. The pressing and moving member 120 is configured to be able to freely rise and lower by means of a drive part 121 such as a cylinder. The pressing and moving member 120 can bring one end portion of the lower wafer $W_L$ and one end portion of the upper wafer $W_U$ facing the one end portion of the lower wafer $W_L$ into abutment with each other and press them at the later-described time of joining the wafers $W_U$, $W_L$ together.

Figure 9:
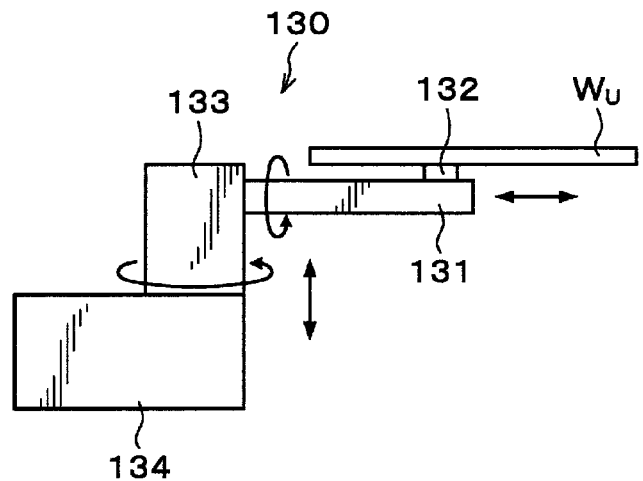
FIG. 9 A side view of a reversing mechanism.

In the transfer region T1, the reversing mechanism 130 moving between the transfer region T1 and the processing region T2 and reversing the front and rear surfaces of the upper wafer $W_U$ is provided. The reversing mechanism 130 has a holding arm 131 holding the upper wafer $W_U$ as illustrated in FIG. 9. On the holding arm 131, a suction pad 132 is provided which sucks and horizontally holds the upper wafer $W_U$. The holding arm 131 is supported on a first drive part 133. By means of the first drive part 133, the holding arm 131 can freely turn around the horizontal axis and expand and contract in the horizontal direction. Below the first drive part 133, a second drive part 134 is provided. By means of the second drive part 134, the first drive part 133 is rotatable around the vertical axis and can rise and lower in the vertical direction. Further, the second drive part 134 is attached to a rail 135 extending in the Y-direction illustrated in FIG. 4 and FIG. 5. The rail 135 extends from the processing region T2 to the transfer region T1. By means of the second drive part 134, the reversing mechanism 130 is movable along the rail 135 between the position adjusting mechanism 90 and the upper chuck 101. Note that the configuration of the reversing mechanism 130 is not limited to that of the above embodiment, but only needs to be able to reverse the front and rear surfaces of the upper wafer $W_U$. Further, the reversing mechanism 130 may be provided in the processing region T2. Further, a reversing mechanism may be given to the wafer transfer body 82 and another transfer means may be provided at the position of the reversing mechanism 130.

Note that in the processing region T2, a later-described lower image-pickup member picking up an image of the front surface $W_{L1}$ of the lower wafer $W_L$ and an upper image-pickup member picking up an image of the front surface $W_{U1}$ of the upper wafer $W_U$ are provided to perform position adjustment in the horizontal direction of the lower wafer $W_L$ held by the lower chuck 100 and the upper wafer $W_U$ held by the upper chuck 101 as will be described later. As the lower image-pickup member and the upper image-pickup member, for example, a wide-angle CCD camera is used.

Figure 10:
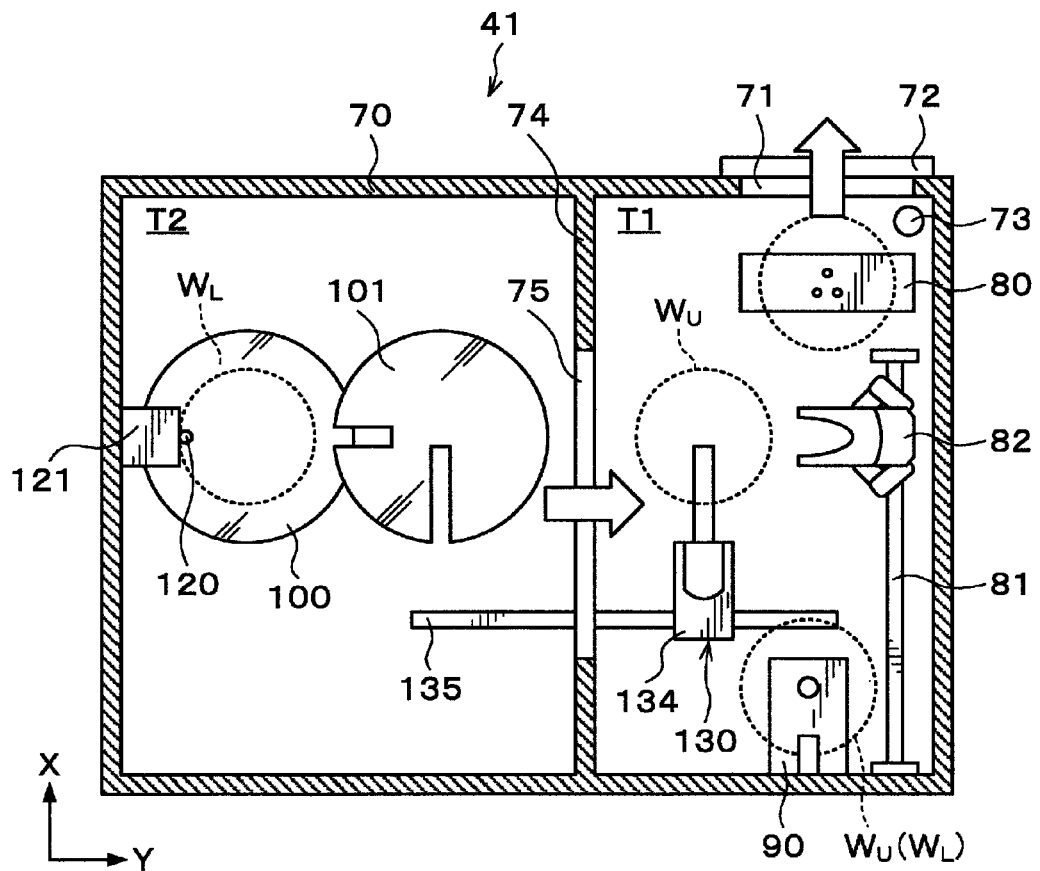
FIG. 10 An explanatory view of airflows generated in the joint apparatus.

Next, an airflow generated between the joint apparatus 41 and the outside of the joint apparatus 41, that is, the wafer transfer region 60, and an airflow generated in the joint apparatus 41 when the wafers $W_U$, $W_L$ are joined together in the joint apparatus 41 configured as described above will be described based on FIG. 10. Note that the arrows in FIG. 10 indicate the directions of the airflows.

The pressure inside the joint apparatus 41 is positive with respect to the pressure inside the wafer transfer region 60. Therefore, when the opening/closing shutter 71 is opened, the airflow from the joint apparatus 41 toward the wafer transfer region 60 is generated.

Further, the atmosphere in the processing container 70 is exhausted through the exhaust port 73 of the transfer region T1 in the joint apparatus 41. Accordingly, the airflow from the processing region T2 toward the transfer region T1 through the transfer-in/out port 75 is generated.

In the above joint system 1, a control unit 200 is provided as illustrated in FIG. 1. The control unit 200 is, for example, a computer and has a program storage part (not illustrated). In the program storage part, a program is stored which controls the processing of the wafers $W_U$, $W_L$ and the superposed wafer $W_T$ in the joint system 1. Further, the program storage part also stores a program for controlling the operation of the driving system of the above-described various processing apparatuses and transfer apparatuses to realize the later-described joint processing in the joint system 1. Note that the programs may be the ones which are stored, for example, in a computer-readable storage medium H such as a computer-readable hard disk (HD), flexible disk (FD), compact disk (CD), magneto-optical disk (MO), or memory card, and installed from the storage medium H into the control unit 200.

Figure 11:
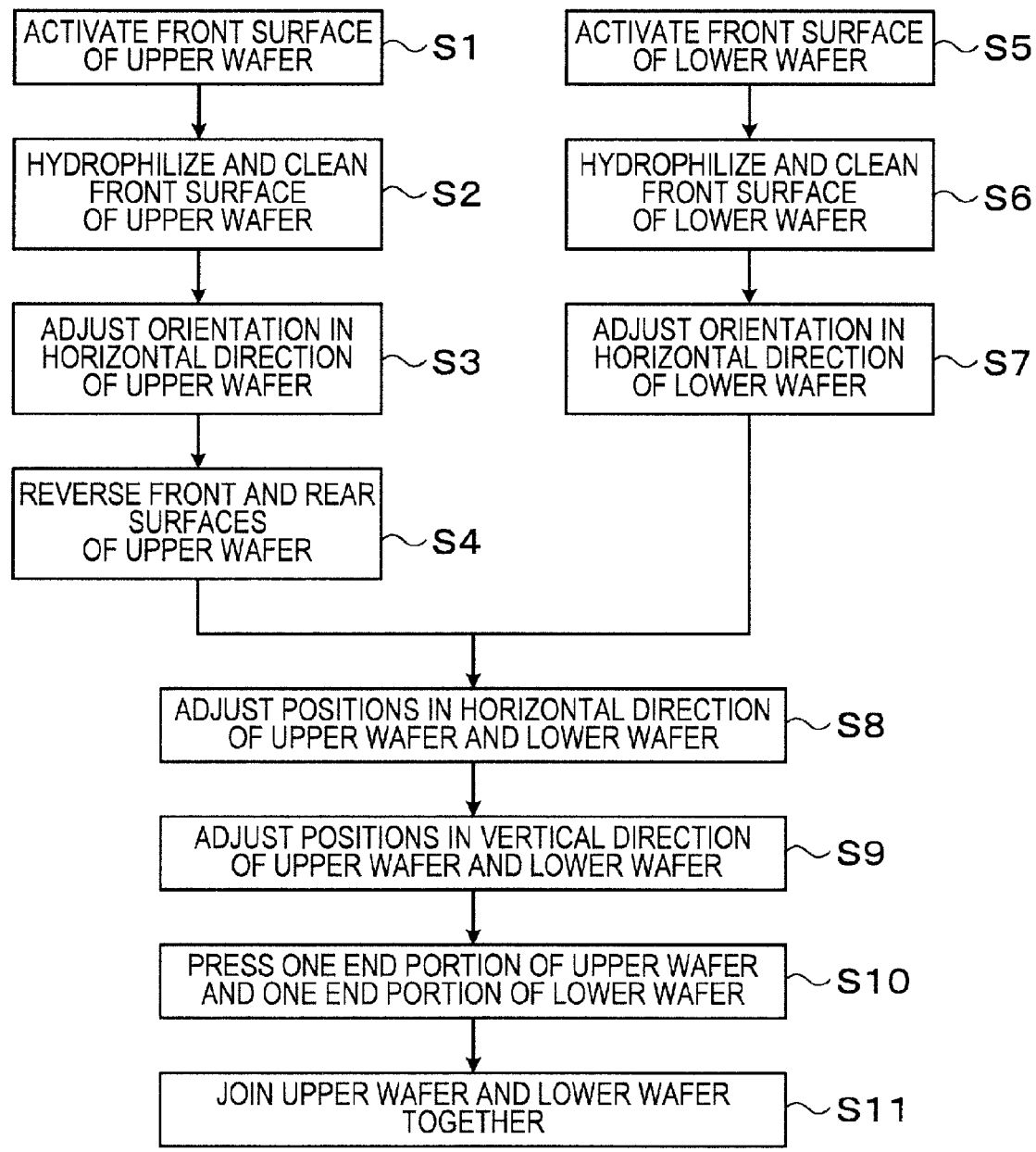
FIG. 11 A flowchart illustrating main steps of wafer joint processing.

Next, the joint processing method of the wafers $W_U$, $W_L$ performed using the joint system 1 configured as described above will be described. FIG. 11 is a flowchart illustrating an example of main steps of the wafer joint processing.

First, a cassette $C_U$ housing a plurality of upper wafers $W_U$, a cassette $C_L$ housing a plurality of lower wafers $W_L$, and an empty cassette $C_T$ are mounted on the predetermined cassette mounting plates 11 in the transfer-in/out station 2. Then, an upper wafer $W_U$ in the cassette $C_U$ is taken out by the wafer transfer apparatus 22 and transferred to the transition apparatus 50 in the third processing block G3 in the processing station 3.

Subsequently, the upper wafer $W_U$ is transferred by the wafer transfer apparatus 61 to the surface activation apparatus 30 in the first processing block G1. In the surface activation apparatus 30, the front surface $W_{U1}$ of the wafer $W_U$ is activated, for example, using radicals made by plasma-exciting a processing gas (Step S1 in FIG. 11).

Then, the upper wafer $W_U$ is transferred by the wafer transfer apparatus 61 to the surface hydrophilizing apparatus 40 in the second processing block G2. In the surface hydrophilizing apparatus 40, for example, pure water is supplied onto the upper wafer $W_U$, and hydroxyls adhere to the front surface $W_{U1}$ of the upper wafer $W_U$ so that the front surface $W_{U1}$ is hydrophilized. Further, the pure water cleans the front surface $W_{U1}$ of the upper wafer $W_U$ (Step S2 in FIG. 11).

Then, the upper wafer $W_U$ is transferred by the wafer transfer apparatus 61 to the joint apparatus 41 in the second processing block G2. The upper wafer $W_U$ transferred into the joint apparatus 41 is transferred by the wafer transfer body 82 to the position adjusting mechanism 90 via the transition 80. Then, the orientation in the horizontal direction of the upper wafer $W_U$ is adjusted by the position adjusting mechanism 90 (Step S3 in FIG. 11).

Subsequently, the upper wafer $W_U$ is transferred from the position adjusting mechanism 90 to the holding arm 131 of the reversing mechanism 130. Subsequently, in the transfer region T1, the holding arm 131 is reversed to reverse the front and rear surfaces of the upper wafer $W_U$ (Step S4 in FIG. 11). In short, the front surface $W_{U1}$ of the upper wafer $W_U$ is directed downward. Thereafter, the reversing mechanism 130 moves to the upper chuck 101 side and the upper wafer $W_U$ is delivered from the reversing mechanism 130 to the upper chuck 101. The upper wafer $W_U$ is held by the upper chuck 101 with the rear surface $W_{U2}$ being sucked. Thereafter, the upper chuck 101 is moved by the chuck drive part 115 to a position above the lower chuck 100 and facing the lower chuck 100. The upper wafer $W_U$ then waits on the upper chuck 101 until the later-described lower wafer $W_L$ is transferred to the joint apparatus 41. Note that the reversal of the front and rear surfaces of the upper wafer $W_U$ may be performed during the movement of the reversing mechanism 130.

During the time when the above-described processing at Steps S1 to S4 is performed on the upper wafer $W_U$, processing is performed on the lower wafer $W_L$ subsequent to the upper wafer $W_U$. First, a lower wafer $W_L$ in the cassette $C_L$ is taken out by the wafer transfer apparatus 22 and transferred to the transition apparatus 50 in the processing station 3.

Subsequently, the lower wafer $W_L$ is transferred by the wafer transfer apparatus 61 to the surface activation apparatus 30, and the front surface $W_{L1}$ of the lower wafer $W_L$ is activated (Step 5 in FIG. 11). Note that the activation of the front surface $W_{L1}$ of the lower wafer $W_L$, at Step S5 is the same as the above-described Step S1.

Then, the lower wafer $W_L$ is transferred by the wafer transfer apparatus 61 to the surface hydrophilizing apparatus 40, and the front surface $W_{L1}$ of the lower wafer $W_L$, is hydrophilized and the front surface $W_{L1}$ is cleaned (Step S6 in FIG. 11). Note that hydrophilization and cleaning of the front surface $W_{L1}$ of the lower wafer $W_L$ at Step S6 is the same as the above-described Step S2.

Then, the lower wafer $W_L$ is transferred by the wafer transfer apparatus 61 to the joint apparatus 41. The lower wafer $W_L$ transferred into the joint apparatus 41 is transferred by the wafer transfer body 82 to the position adjusting mechanism 90 via the transition 80. Then, the orientation in the horizontal direction of the lower wafer $W_L$ is adjusted by the position adjusting mechanism 90 (Step S7 in FIG. 11).

Subsequently, the lower wafer $W_L$ is transferred by the wafer transfer body 82 to the lower chuck 100 and suction-held by the lower chuck 100. In this event, the rear surface $W_{L2}$, of the lower wafer $W_L$ is held by the lower chuck 100 so that the front surface $W_{L1}$ of the lower wafer $W_L$ is directed upward. Note that a groove (not illustrated) conforming to the shape of the wafer transfer body 82 may be formed in the upper surface of the lower chuck 100 so as to prevent interference between the wafer transfer body 82 and the lower chuck 100 when delivering the lower wafer $W_L$.

Figure 12:
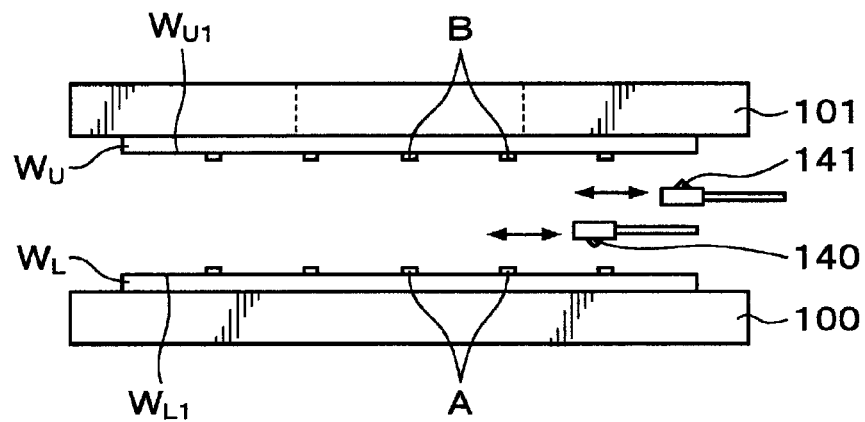
FIG. 12 An explanatory view illustrating the appearance that the positions in the horizontal direction of the upper wafer and the lower wafer are adjusted.

Then, position adjustment in the horizontal direction of the lower wafer $W_L$ held by the lower chuck 100 and the upper wafer $W_U$ held by the upper chuck 101 is performed. As illustrated in FIG. 12, a plurality of predetermined reference points A are formed on the front surface $W_{L1}$ of the lower wafer $W_L$, and a plurality of predetermined reference points B are similarly formed on the front surface $W_{U1}$ of the upper wafer $W_U$. Then, a lower image-pickup member 140 is moved in the horizontal direction and an image of the front surface $W_{L1}$ of the lower wafer $W_L$ is picked up. Further, an upper image-pickup member 141 is moved in the horizontal direction and an image of the front surface $W_{U1}$ of the upper wafer $W_U$ is picked up. Thereafter, the position in the horizontal direction of the upper wafer $W_U$ is adjusted by the upper chuck 101 so that the positions of the reference points A on the lower wafer $W_L$ indicated in the image picked up by the lower image-pickup member 140 coincide with the positions of the reference points B on the upper wafer $W_U$ indicated in the image picked up by the upper image-pickup member 141. In this manner, the positions in the horizontal direction of the upper wafer $W_U$ and the lower wafer $W_L$ are adjusted (Step S8 in FIG. 11). Note that the lower image-pickup member 140 and the upper image-pickup member 141 constitute another position adjusting mechanism in this embodiment. Further, if the lower chuck 100 is movable in the horizontal direction by the chuck drive part 103, the position in the horizontal direction of the lower wafer $W_L$ may be adjusted by the lower chuck 100, or the relative positions in the horizontal direction of the lower wafer $W_L$ and the upper wafer $W_U$ may be adjusted by the lower chuck 100 and the upper chuck 101.

Figure 13:
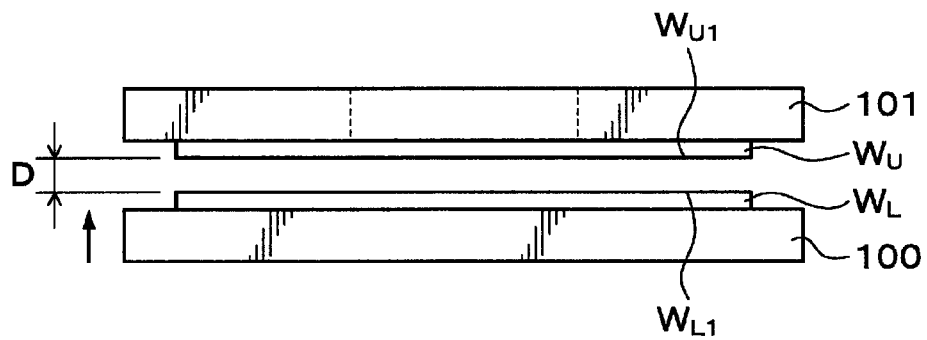
FIG. 13 An explanatory view illustrating the appearance that the positions in the vertical direction of the upper wafer and the lower wafer are adjusted.

Thereafter, the chuck drive part 103 raises the lower chuck 100 to dispose the lower wafer $W_L$ at a predetermined position as illustrated in FIG. 13. In this event, the lower wafer $W_L$ is disposed so that the a distance D between the front surface $W_{L1}$ of the lower wafer $W_L$ and the front surface $W_{U1}$ of the upper wafer $W_U$ is a predetermined distance, for example, 0.5 mm. In this manner, the positions in the vertical direction of the upper wafer $W_U$ and the lower wafer $W_L$ are adjusted (Step S9 in FIG. 11).

Figure 14:
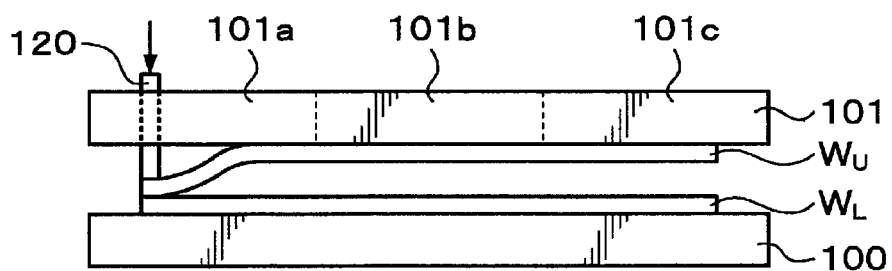
FIG. 14 An explanatory view illustrating the appearance that a pressing and moving member presses one end portion of the upper wafer and one end portion of the lower wafer.

Thereafter, the pressing and moving member 120 is lowered to bring the one end portion of the lower wafer $W_L$ and the one end portion of the upper wafer $W_U$ into abutment and press them as illustrated in FIG. 14 (Step S10 in FIG. 11). In this event, the upper wafer $W_U$ is vacuumed in all of the regions 101a, 101b, 101c of the upper chuck 101.

Figure 15:
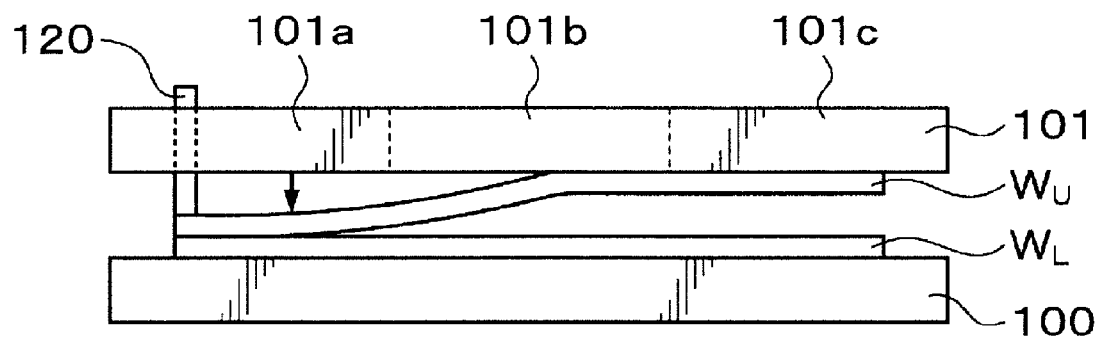
FIG. 15 An explanatory view illustrating the appearance that vacuuming of the upper chuck is stopped for each region.
Figure 16:
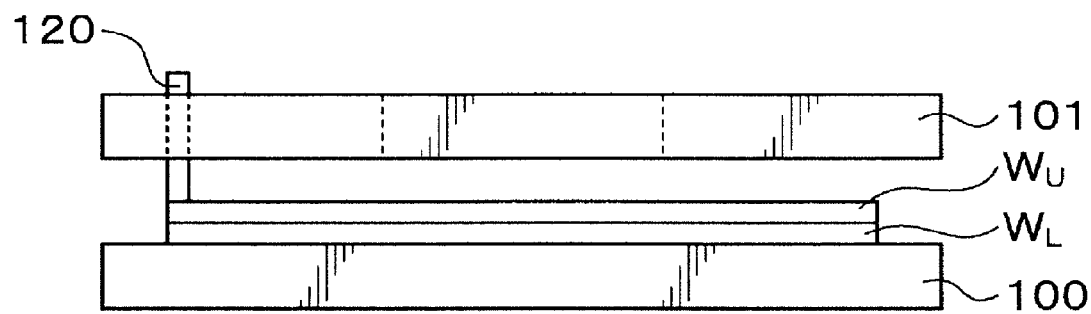
FIG. 16 An explanatory view illustrating the appearance that the upper wafer and the lower wafer are joined together.
Figure 17:
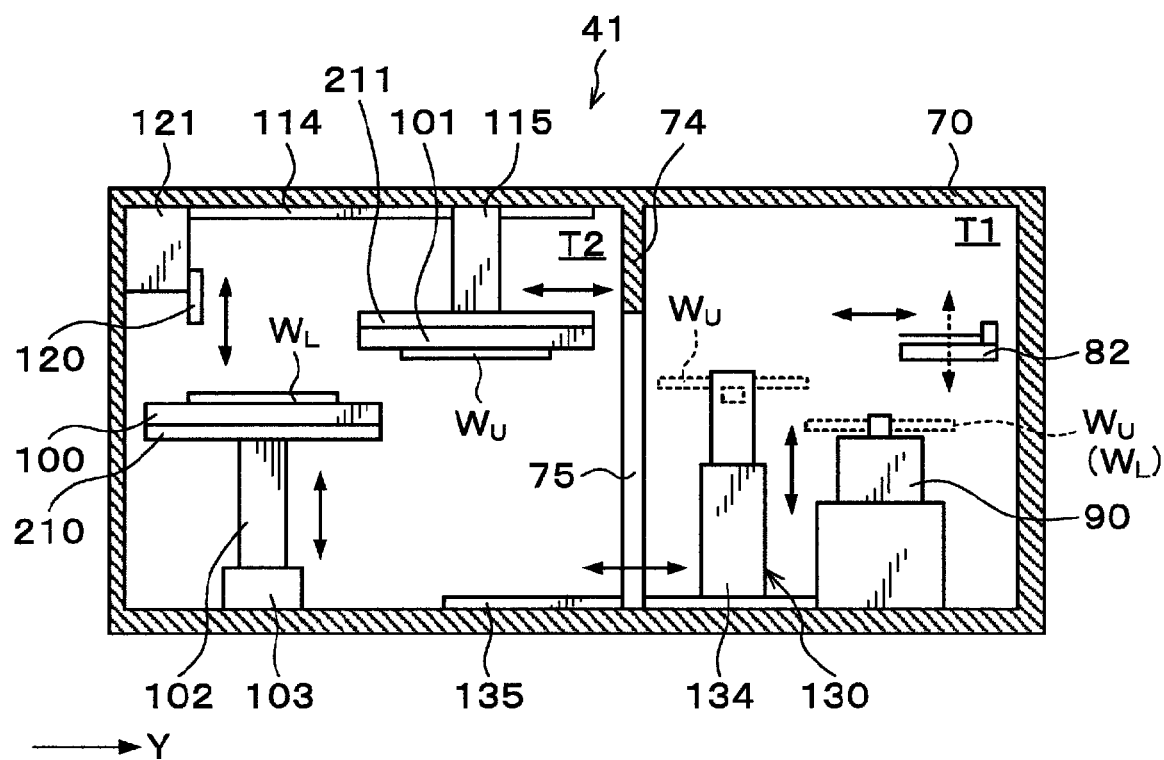
FIG. 17 A longitudinal sectional view illustrating the outline of the configuration of a joint apparatus according to another embodiment.

Thereafter, in the state that the one end portion of the lower wafer $W_L$ and the one end portion of the upper wafer $W_U$ are pressed by the pressing and moving member 120 as illustrated in FIG. 15, the vacuuming of the upper wafer $W_U$ in the region 101a of the upper chuck 101 is stopped. Thereby, the upper wafer $W_U$ held in the region 101a falls onto the lower wafer $W_L$. Then, the vacuuming of the upper wafer $W_U$ is stopped in the order of the regions 101a, 101b, 101c from the one end side to the other end side of the upper wafer $W_U$ to bring the upper wafer $W_U$ into abutment with the lower wafer $W_L$ in sequence. In this manner, the front surface $W_{U1}$ of the upper wafer $W_U$ is brought into abutment with the entire front surface $W_{L1}$ of the lower wafer $W_L$ as illustrated in FIG. 16. Since the front surface $W_{U1}$ of the upper wafer $W_U$ and the front surface $W_{L1}$ of the lower wafer $W_L$ in abutment have been activated at Steps S1 and S5 respectively, the Van der Waals force is generated first between the front surfaces $W_{U1}$ and $W_{L1}$ so that the front surfaces $W_{U1}$ and $W_{L1}$ are joined together. Since the front surface $W_{U1}$ of the upper wafer $W_U$ and the front surface $W_{L1}$ of the lower wafer $W_L$ have been thereafter hydrophilized at Steps S2, S6 respectively, hydrophilic groups between the front surfaces $W_{U1}$ and $W_{L1}$ are hydrogen-bonded, so that the front surfaces $W_{U1}$, $W_{L1}$ are strongly joined together. In this manner, the upper wafer $W_U$ and the lower wafer $W_L$ are joined together (Step S11 in FIG. 11).

Note that though the vacuuming of the upper wafer $W_U$ is stopped in the order of the regions 101a, 101b, 101c in this embodiment, the method of stopping the vacuuming is not limited to this. For example, the vacuuming in the regions 101a, 101b may be stopped at the same time, and then the vacuuming in the region 101c may be stopped. Further, the time interval of stopping the vacuuming between the regions 101a, 101b, 101c may be changed. For example, after a lapse of one second after the stop of the vacuuming in the region 101a, the vacuuming in the regions 101b may be stopped, and after a lapse of two seconds after the stop of the vacuuming in the region 101b, the vacuuming in the region 101c may be stopped.

The superposed wafer $W_T$ in which the upper wafer $W_U$ and the lower wafer $W_L$ are joined together is transferred by the wafer transfer apparatus 61 to the transition apparatus 51 and then transferred by the wafer transfer apparatus 22 in the transfer-in/out station 2 to the cassette $C_T$ on a predetermined mounting plate 11. Thus, a series of joint processing of the wafers $W_U$, $W_L$ ends.

According to the above embodiment, in the state that the one end portion of the lower wafer $W_L$ and the one end portion of the upper wafer $W_U$ are pressed to each other, the upper wafer $W_U$ is brought into abutment with the lower wafer $W_L$ in sequence from the one end portion side to the other end portion side of the upper wafer $W_U$ at Step S11 in the joint apparatus 41. Accordingly, even if air which can form void exists between the lower wafer $W_L$ and the upper wafer $W_U$, the air will exist at all times outside the position where the upper wafer $W_U$ and the lower wafer $W_L$ are in abutment with each other, that is, on the other end portion side, thereby allowing the air to escape in one direction from between the wafers $W_U$ and $W_L$. Therefore, according to this embodiment, it is possible to appropriately join the wafers $W_U$, $W_L$ together while suppressing the generation of void between the wafers $W_U$ and $W_L$. In addition, according to this embodiment, since it is unnecessary to bring the atmosphere when joining the wafers $W_U$, $W_L$ together into a vacuum atmosphere as in the prior art, the joint of the wafers $W_U$, $W_L$ can be efficiently performed in a short time, resulting in an improved throughput of the wafer joint processing. Further, according to this embodiment, since the one end portion of the upper wafer $W_U$ and the one end portion of the lower wafer $W_L$ can be brought into abutment with each other in the state that the upper wafer $W_U$ is held by the upper chuck 101, the joint of the wafers $W_U$, $W_L$ can be appropriately performed without positional displacement of the position of the upper wafer $W_U$ with respect to the lower wafer $W_L$.

Further, since the upper chuck 101 of the joint apparatus 41 is divided into a plurality of regions 101a, 101b, 101c and the vacuuming of the upper wafer $W_U$ can be set for each of the regions 101a, 101b, 101c, it is possible to surely bring the upper wafer $W_U$ into abutment with the lower wafer $W_L$ in sequence from the one end portion side to the other end portion side of the upper wafer $W_U$ at Step S11. Accordingly, it is possible to allow the air between the wafers $W_U$ and $W_L$ to escape, and to surely suppress the generation of void between the wafers $W_U$ and $W_L$.

Further, the front surfaces of the wafers $W_U$, $W_L$ have been activated at Steps S1 and S5 in the surface activation apparatus 30 respectively, and the front surfaces $W_{U1}$, $W_{L1}$ of the wafers $W_U$, $W_L$ have been hydrophilized respectively and hydroxyls adhere to the front surfaces $W_{U1}$, $W_{L1}$ at Steps S2, S6 in the surface hydrophilizing apparatus 40. Therefore, after the activated front surfaces $W_{U1}$, $W_{L1}$ of the wafers $W_U$, $W_L$ are joined together by the Van der Waals force, the hydroxyls on the hydrophilized front surfaces $W_{U1}$, $W_{L1}$ of the wafers $W_U$, $W_L$ are hydrogen-bonded, whereby the wafers $W_U$, $W_L$ can be strongly joined together at Step S11 in the joint apparatus 41. Therefore, it is unnecessary to press the wafers in the state that they are superposed. This enables prevention of breakage of the wafers due to press. Furthermore, since the wafers $W_U$, $W_L$ are joined together only by the Van der Waals force and hydrogen bonding, the time required for joint can be reduced to improve the throughput of the wafer joint processing.

Further, the orientations in the horizontal direction of the wafers $W_U$, $W_L$ are adjusted at Steps S3, S7 in the joint apparatus 41 respectively and the positions in the horizontal direction and the vertical direction of the wafers $W_U$, $W_L$ are adjusted at Steps S8, S9. Accordingly, the wafers $W_U$, $W_L$ can then be appropriately joined together at Step S11.

Further, since the pressure inside the joint apparatus 41 is positive with respect to the pressure inside the wafer transfer region 60 in the joint system 1, an airflow from the joint apparatus 41 toward the wafer transfer region 60 is generated. In short, the atmosphere never flows from the outside into the joint apparatus 41. Therefore, particles and the like never flow into the joint apparatus 41 from the outside, so that the joint of the wafers $W_U$, $W_L$ can be appropriately performed.

In the joint apparatus 41 in the above embodiment, a cooling mechanism 210 may be provided on the lower surface side of the lower chuck 100, and a cooling mechanism 211 may be provided on the upper surface side of the upper chuck 101. Inside the cooling mechanism 210, 211, a cooling member (not illustrated) such as a cooling water or a Peltier element is embedded. The cooling temperatures of the cooling mechanisms 210, 211 are controlled by the control unit 200 so that the lower wafer $W_L$ held by the lower chuck 100 is cooled to a predetermined temperature equal to or lower than room temperature (23° C.), and the upper wafer $W_L$ held by the upper chuck 101 is cooled to a predetermined temperature equal to or lower than room temperature (23° C.). Note that though the cooling mechanisms 210, 211 are provided both in the lower chuck 100 and the upper chuck 101 in this embodiment, the cooling mechanism 210 may be provided only in the lower chuck 100 or the cooling mechanism 211 may be provided only in the upper chuck 101. Further, in place of the cooling mechanisms 210, 211, a cooling apparatus cooling the joined superposed wafer $W_T$ may be stacked on the transition apparatuses 50, 51 in the third processing block G3 in the processing station 3.

In this case, the wafers $W_U$, $W_L$ are joined together while the lower wafer $W_L$ held by the lower chuck 100 and the upper wafer $W_U$ held by the upper chuck 101 are being cooled to a predetermined temperature, for example, 10° C. at the above-described Step S11. In this event, since the wafers $W_U$, $W_L$ are cooled to room temperature or lower, joint of the front surfaces $W_{U1}$, $W_{L1}$ of the wafers $W_U$, $W_L$ by the Van der Waals force and hydrogen bonding are accelerated. Accordingly, the throughput of the wafer joint processing can be further improved.

Figure 18:
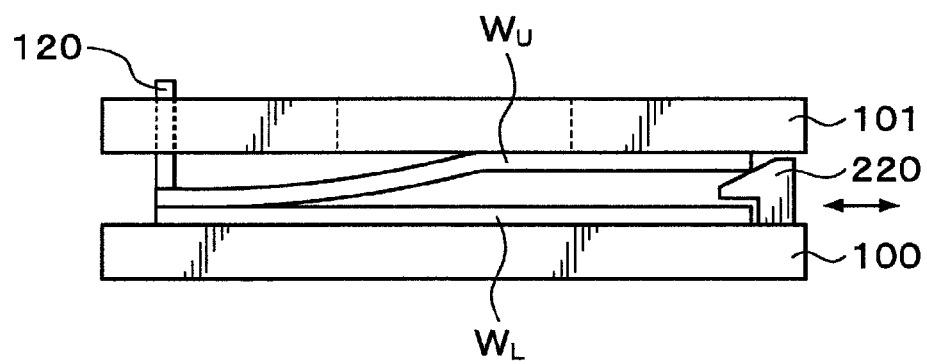
FIG. 18 An explanatory view illustrating the appearance of the joint apparatus according to another embodiment near the upper chuck and the lower chuck.

In the joint apparatus 41 in the above embodiment, a guide member 220 may be disposed which is movable in the horizontal direction between the lower chuck 100 and the upper chuck 101 as illustrated in FIG. 18. The guide member 220 is disposed to face the pressing and moving member 120. Further, the guide member 220 supports the other end portion of the upper wafer $W_U$ held by the upper chuck 101, that is, the end portion facing the one end portion of the upper wafer $W_U$ pressed by the pressing and moving member 120. The supporting surface of the upper wafer $W_U$ in the guide member 220 is inclined from the horizontal direction. Further, the guide member 220 is provided in a manner not to come into abutment with the lower wafer $W_L$ held by the lower chuck 100.

In this case, when bringing the upper wafer $W_U$ into abutment with the lower wafer $W_L$ in sequence from the one end portion side to the other end portion side of the upper wafer $W_U$ at the above-described Step S11, the guide member 220 is moved from the one end portion side to the other end portion side of the upper wafer $W_U$ in concert with the motion of the upper wafer $W_U$. According to this embodiment, the guide member 220 can surely bring the upper wafer $W_U$ into abutment with the lower wafer $W_L$ in sequence from the one end portion side to the other end portion side of the upper wafer $W_U$. Accordingly, it is possible to allow the air between the wafers $W_U$ and $W_L$ to escape, and to surely suppress the generation of void between the wafers $W_U$ and $W_L$.

Preferred embodiments of the present invention have been described above with reference to the accompanying drawings, but the present invention is not limited to the embodiments. It should be understood that various changes and modifications are readily apparent to those skilled in the art within the scope of the spirit as set forth in claims, and those should also be covered by the technical scope of the present invention. The present invention is not limited to the embodiments but can take various forms. The present invention is also applicable to the case where the substrate is a substrate other than the wafer, such as an FPD (Flat Panel Display), a mask reticle for a photomask or the like.

INDUSTRIAL APPLICABILITY

The present invention is useful in joining substrates such as semiconductor wafers together.

EXPLANATION OF CODES 1 joint system
41 joint apparatus
70 processing container
73 exhaust port
80 transition
81 transfer path
82 wafer transfer body
90 position adjusting mechanism
100 lower chuck
101 upper chuck
101a, 101b, 101c region
112a, 112b, 112c suction pipe
113a, 113b, 113c vacuum pump
114 rail
115 chuck drive part
120 pressing and moving mechanism
130 reversing mechanism
140 lower image-pickup member
141 upper image-pickup member
200 control unit
210, 211 cooling mechanism
220 guide member
A, B reference point
$W_U$ upper wafer
$W_{U1}$ front surface
$W_L$ lower wafer
$W_{L1}$ front surface
$W_T$ superposed wafer

What is claimed:
1. A joint apparatus joining substrates together, comprising:
a first holding member mounting and holding a first substrate on an upper surface thereof;
a second holding member provided above said first holding member to face said first holding member, and holding a second substrate on a lower surface thereof;
a pressing and moving member bringing one end portion of the first substrate and one end portion of the second substrate facing the one end portion of the first substrate into abutment with each other and pressing the one end portions when joining the first substrate and the second substrate together;
a reversing mechanism reversing front and rear surfaces of the second substrate; and
a transfer mechanism transferring the first substrate, the second substrate, or a superposed substrate inside said joint apparatus.
2. The joint apparatus as set forth in claim 1,
wherein said second holding member suction-holds the second substrate by vacuuming the second substrate, and
wherein said second holding member is divided into a plurality of regions, and the vacuuming of the second substrate is settable for each of the regions.
3. The joint apparatus as set forth in claim 1,
wherein a pressure inside said joint apparatus is positive with respect to an external pressure.
4. The joint apparatus as set forth in claim 1,
wherein at least said first holding member or said second holding member has a cooling mechanism cooling at least the first substrate or the second substrate.
5. The joint apparatus as set forth in claim 1, further comprising:
a position adjusting mechanism adjusting an orientation in a horizontal direction of the first substrate or the second substrate,
wherein said reversing mechanism is movable between said position adjusting mechanism and said second holding member.
6. The joint apparatus as set forth in claim 1, further comprising:
a transition temporarily mounting the first substrate, the second substrate, or the superposed substrate thereon to transfer in/out the first substrate, the second substrate, or the superposed substrate to/from an outside.
7. The joint apparatus as set forth in claim 1, further comprising:
a guide member disposed between said first holding member and said second holding member and to face said pressing and moving member,
wherein said guide member is configured to support another end portion of the second substrate held by said second holding member and to be movable in a horizontal direction.
8. The joint apparatus as set forth in claim 1, further comprising:
a moving mechanism moving said first holding member or said second holding member relatively in a horizontal direction; and
another position adjusting mechanism controlling said moving mechanism to perform alignment in the horizontal direction of the first substrate held by said first holding member with the second substrate held by said second holding member,
wherein said another position adjusting mechanism includes a first image-pickup member picking up an image of a front surface of the first substrate and a second image-pickup member picking up an image of a front surface of the second substrate, and
wherein said moving mechanism adjusts relative positions in the horizontal direction of said first holding member and said second holding member so that a reference point on the first substrate in an image picked up by said first image-pickup member coincides with a reference point on the second substrate in an image picked up by said second image-pickup member.
9. A joint apparatus joining substrates together, comprising:
a first holding member mounting and holding a first substrate on an upper surface thereof;
a second holding member provided above said first holding member to face said first holding member, and holding a second substrate on a lower surface thereof;
a pressing and moving member bringing one part of the first substrate and one part of the second substrate facing the one part of the first substrate into abutment with each other and pressing the one parts when joining the first substrate and the second substrate together;
a reversing mechanism reversing front and rear surfaces of the second substrate; and a transfer mechanism transferring the first substrate, the second substrate, or a superposed substrate inside said joint apparatus.

10. The joint apparatus as set forth in claim 9,
wherein said second holding member suction-holds the second substrate by vacuuming the second substrate, and
wherein said second holding member is divided into a plurality of regions, and the vacuuming of the second substrate is settable for each of the regions.

11. The joint apparatus as set forth in claim 9,
wherein a pressure inside said joint apparatus is positive with respect to an external pressure.

12. The joint apparatus as set forth in claim 9,
wherein at least said first holding member or said second holding member has a cooling mechanism cooling at least the first substrate or the second substrate.

13. The joint apparatus as set forth in claim 9, further comprising:
a position adjusting mechanism adjusting an orientation in a horizontal direction of the first substrate or the second substrate,
wherein said reversing mechanism is movable between said position adjusting mechanism and said second holding member.

14. The joint apparatus as set forth in claim 9, further comprising:
a transition temporarily mounting the first substrate, the second substrate, or the superposed substrate thereon to transfer in/out the first substrate, the second substrate, or the superposed substrate to/from an outside.

15. The joint apparatus as set forth in claim 9,
wherein said pressing and moving member brings one end portion of the first substrate and one end portion of the second substrate facing the one end portion of the first substrate into abutment with each other and pressing the one end portions when joining the first substrate and the second substrate together,
wherein said joint apparatus further comprises a guide member disposed between said first holding member and said second holding member and to face said pressing and moving member, and
wherein said guide member is configured to support another end portion of the second substrate held by said second holding member and to be movable in a horizontal direction.

16. The joint apparatus as set forth in claim 9, further comprising:
a moving mechanism moving said first holding member or said second holding member relatively in a horizontal direction; and
another position adjusting mechanism controlling said moving mechanism to perform alignment in the horizontal direction of the first substrate held by said first holding member with the second substrate held by said second holding member,
wherein said another position adjusting mechanism includes a first image-pickup member picking up an image of a front surface of the first substrate and a second image-pickup member picking up an image of a front surface of the second substrate, and
wherein said moving mechanism adjusts relative positions in the horizontal direction of said first holding member and said second holding member so that a reference point on the first substrate in an image picked up by said first image-pickup member coincides with a reference point on the second substrate in an image picked up by said second image-pickup member.

\* \* \* \* \*